United States Patent
Lamesch et al.

(10) Patent No.: US 10,457,236 B2
(45) Date of Patent: Oct. 29, 2019

(54) CAPACITIVE SEAT OCCUPANCY DETECTION AND CLASSIFICATION SYSTEM

(71) Applicant: IEE INTERNATIONAL ELECTRONICS & ENGINEERING S.A., Echternach (LU)

(72) Inventors: Laurent Lamesch, Reichlange (LU); Michael Putz, Trier (DE)

(73) Assignee: IEE International Electronics & Engineering S.A., Echternach (LU)

( * ) Notice: Subject to any disclaimer, the term of this patent is extended or adjusted under 35 U.S.C. 154(b) by 0 days.

(21) Appl. No.: 16/073,211

(22) PCT Filed: Jan. 24, 2017

(86) PCT No.: PCT/EP2017/051357
§ 371 (c)(1),
(2) Date: Jul. 26, 2018

(87) PCT Pub. No.: WO2017/129533
PCT Pub. Date: Aug. 3, 2017

(65) Prior Publication Data
US 2019/0031130 A1  Jan. 31, 2019

(30) Foreign Application Priority Data
Jan. 26, 2016 (LU) .......................... 92962

(51) Int. Cl.
*B60R 21/015* (2006.01)
*B60N 2/00* (2006.01)
*H03K 17/955* (2006.01)

(52) U.S. Cl.
CPC ........ *B60R 21/01532* (2014.10); *B60N 2/002* (2013.01); *H03K 17/955* (2013.01);
(Continued)

(58) Field of Classification Search
CPC ........ B60N 2/002; B60N 2/5685; B60N 2/64; B60Q 2300/22; B60R 21/01532;
(Continued)

(56) References Cited

U.S. PATENT DOCUMENTS

| 5,291,803 A | 3/1994 | Yamaguchi |
| 2006/0087160 A1* | 4/2006 | Dong ................. A47C 7/72 297/180.13 |

(Continued)

FOREIGN PATENT DOCUMENTS

| EP | 2572943 A1 | 3/2013 |
| WO | WO0044018 A1 | 7/2000 |
| WO | WO0103978 A1 | 1/2001 |
| WO | WO2011079092 A1 | 6/2011 |

OTHER PUBLICATIONS

International Search Report for International application No. PCT/EP2017/051357, dated Jan. 24, 2017, 4 pages.
(Continued)

*Primary Examiner* — Dalena Tran
(74) *Attorney, Agent, or Firm* — Reising Ethington P.C.

(57) ABSTRACT

A capacitive vehicle seat occupancy detection and classification system includes an impedance measurement circuit and a control and evaluation unit. The impedance measurement circuit is configured for providing periodic electrical measurement signals to a capacitive sensor of N different fundamental frequencies, wherein N is a natural number of at least 3, and to determine a complex impedance from each of determined sense currents in the capacitive sensor. The control and evaluation unit is configured to determine a seat occupancy class for each one of the complex impedances determined at the at least N different fundamental frequencies, and to determine a final seat occupancy class derived by a majority decision among the determined seat occupancy classes.

10 Claims, 3 Drawing Sheets

(52) U.S. Cl.
CPC .............. *B60Q 2300/22* (2013.01); *H03K 2217/96071* (2013.01); *H03K 2217/960735* (2013.01)

(58) Field of Classification Search
CPC .......... B60R 21/0154; B60R 21/01556; H03K 17/955; H03K 2217/96071; H03K 2217/960735
USPC .............. 701/45, 70, 301; 324/658, 686; 180/282; 280/735
See application file for complete search history.

(56) References Cited

U.S. PATENT DOCUMENTS

| | | | |
|---|---|---|---|
| 2007/0262574 A1 | 11/2007 | Breed et al. | |
| 2010/0117845 A1 | 5/2010 | Satz et al. | |
| 2010/0207773 A1* | 8/2010 | Hayakawa | B60N 2/002 340/667 |
| 2010/0315099 A1* | 12/2010 | Ootaka | B60N 2/002 324/679 |
| 2014/0267157 A1 | 9/2014 | Dorfner | |

OTHER PUBLICATIONS

Written Opinion for International application No. PCT/EP2017/051357, dated Jan. 24, 2017, 6 pages.
Smith, J.R., Electric Field Sensing for Graphical Interfaces, IEEE Computer Graph. Appl., vol. 18, No. 3, May/Jun. 1998. pp. 54-60.

\* cited by examiner

CAPACITIVE SEAT OCCUPANCY DETECTION AND CLASSIFICATION SYSTEM

TECHNICAL FIELD

The invention relates to a capacitive seat occupancy detection and classification system, in particular a vehicle seat occupancy detection and classification system, a method of operating such capacitive seat occupancy detection and classification system, and a vehicle seat comprising such capacitive seat occupancy detection and classification system.

BACKGROUND OF THE INVENTION

Vehicle seat occupancy detection and/or classification systems are nowadays widely used in vehicles, in particular in passenger cars, for providing a seat occupancy signal for various appliances, for instance for the purpose of a seat belt reminder (SBR) system or an activation control for an auxiliary restraint system (ARS). Numerous seat occupancy detection and/or classification systems include seat occupancy sensors that are based on capacitive sensing, employing capacitive sensors.

The term "capacitive sensor" designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which may be identical with or different from emitting antenna electrodes—at which the influence of an object or living being on the electric field is detected.

Vehicle seat occupancy detection and/or classification systems are known to be employed as a means of assessing a potential activation of an installed vehicle passenger restraint system, such as an airbag. An output signal of the seat occupancy detection and/or classification system is usually transferred to an electronic control unit of the vehicle to serve, for instance, as a basis for a decision to deploy an air bag system to the vehicle seat.

International application WO 2011/079092 A1 describes an occupant detection system and a method for detecting an occupant seated in a vehicle seat. An electrode is arranged in a seat proximate to an expected location of an occupant for sensing an occupant proximate thereto. The electrode may be integrated with a seat heater. Control circuitry controls the seat heater. A signal generator is coupled to the electrode and configured to output to the electrode a plurality of signals at a plurality of frequencies. Occupant detection circuitry detects voltages responsive to the plurality of signals at the plurality of frequencies and detects a state of occupancy based on the detected voltages. An LC circuit coupled to the electrode and the control circuitry suppresses capacitance generated by the control circuitry.

Document EP 2 572 943 A1 discloses a combined heating and capacitive seat occupant sensing system. The system comprises a heating element which is also used as antenna electrode for a capacitive sensing circuit. The system further comprises a common choke connected to the terminals of the heating element for DC-coupling the heating element to a heating current supply. The capacitive sensing is configured to drive two alternating currents with two different frequencies into the heating element, and to determine occupancy of the seat based on calculations, taking into account the behavior of the common choke.

SUMMARY

It has been observed that a capacitive measurement circuit of a vehicle seat occupancy detection and/or classification system that is designed for operating at a carrier frequency of >1 MHz (for example 4 to 6 MHz) is easily disturbed by resonances present in the measurement system due to parasitic inductances and capacitances.

It is therefore an object of the invention to provide a capacitive measurement circuit for a vehicle seat occupancy detection and/or classification system with improved robustness with regard to an ability to correctly classify a seat occupancy.

In one aspect of the present invention, the object is achieved by a capacitive seat occupancy detection and classification system, in particular a vehicle seat occupancy detection and classification system that includes an impedance measurement circuit and a control and evaluation unit.

The impedance measurement circuit comprises a signal voltage source that is configured for providing periodic electrical measurement signals at an output port. A capacitive sensor is electrically connectable to the output port for receiving the electrical measurement signals. The signal voltage source is configured to generate periodic measurement signals of N different fundamental frequencies, wherein N is a natural number of at least 3 (i.e. 3, 4, 5, etc.).

Further, the impedance measurement circuit includes a sense current measurement circuit that is configured to determine complex sense currents, which are being generated in the capacitive sensor by the provided periodic measurement signals of the at least N different fundamental frequencies. The complex sense currents are indicative of a position of an object relative to the capacitive sensor.

Moreover, the impedance measurement circuit comprises a signal processing unit that is configured to determine a complex impedance from each of the determined sense currents with reference to a complex reference potential, and to provide output signals that are representative of the complex impedances determined at the at least N different fundamental frequencies.

Then, the capacitive seat occupancy detection and classification system includes a control and evaluation unit, which is configured to receive the output signals provided by the signal processing unit, to compare each of the complex impedances determined at the at least N different fundamental frequencies to predetermined threshold values, and, based on the result of the comparing, to determine a seat occupancy class for each one of the complex impedances determined at the at least N different fundamental frequencies.

The control and evaluation unit is further configured to determine a final seat occupancy class derived by a majority decision among the seat occupancy classes which have been determined for each one of the complex impedances determined at one of the at least N different fundamental frequencies.

According to an important aspect of the invention, N equals $[(2\times n)+1]$, with n being a natural number larger than 1 representing the number of potential resonances or electromagnetic (EM) narrowband interferences, I.e. N may equal 5, 7, 9, etc., by which chances of only a minor fraction of the different fundamental frequencies being disturbed by a number of n resonances or electromagnetic (EM) narrowband interferences, which are present due to parasitic inductances and capacitances, can beneficially be increased.

The term "vehicle", as used in this application, shall particularly be understood to encompass passenger cars, trucks and buses.

The term "electrically connectable", as used in this application, shall be understood to encompass galvanic electrical connections as well as connections established by capacitive and/or inductive electromagnetic coupling.

The phrase "being configured to", as used in this application, shall in particular be understood as being specifically programmed, laid out, furnished or arranged.

The term "fundamental frequency", as used in this application, shall particularly be understood as a lowest sinusoidal frequency in a Fourier analysis of a periodic electrical measurement signal.

The phrase "different fundamental frequencies", as used in this application, shall particularly be understood such that the two periodic measurement signals having different fundamental frequencies do not overlap in the frequency domain.

It is further noted herewith that the terms "first", "second", etc. are used in this application for distinction purposes only, and are not meant to indicate or anticipate a sequence or a priority in any way.

By taking the effort of generating additional periodic electrical measurement signals and providing them to a capacitive sensor, improved robustness with regard to an ability to correctly classify a seat occupancy can be accomplished. This is based on the insight that for a given number of different fundamental frequencies chances are high that only a fraction of these different fundamental frequencies are disturbed by resonances which are present due to parasitic inductances and capacitances in an installed state of a capacitive seat occupancy detection and classification system.

The seat occupant classes may be determined from a group of predefined seat occupant classes which may comprise classes including but not limited to "empty", "child", "child in child restraint system" and "adult".

In some embodiments, the N different fundamental frequencies, wherein N is a natural number of at least 3, are equidistantly spaced in the frequency domain.

In some embodiments, the N different fundamental frequencies, wherein N is a natural number of at least 3, are located at random in the frequency domain.

Preferably, the capacitive sensor is operated in loading mode. The term "loading mode", as used in this application, shall be understood particularly as a mode of measuring a displacement current caused by the presence of a grounded object in proximity of a single sense electrode (cf. J. Smith et al., *Electric field sensing for graphical interfaces*, IEEE Comput. Graph. Appl., 18(3):54-60, 1998). In general, it is also contemplated to operate the capacitive sensor in transmit mode or in shunt mode in some embodiments. Both these modes are also described in the above-mentioned article, which shall hereby be incorporated by reference in its entirety with effect for the jurisdictions permitting incorporation by reference.

Preferably, the control and evaluation unit is configured to generate an output signal that is indicative of the determined final seat occupancy class. By that, the information regarding the determined final seat occupancy class can readily be transferred to an electronic control unit of the vehicle to serve, for instance, as a basis for a decision to deploy an auxiliary restraint system (ARS) such as an air bag system to the vehicle seat, for instance via a CAN communication link, as is well known in the art.

In a preferred embodiment of the capacitive seat occupancy detection and classification system, N equals [(2×n)+1+k], with n being a natural number larger than 1 representing the number of potential resonances, and k being a number of potential narrowband interferences of the impedance measurement circuit in an installed state of the seat occupancy detection and classification system. By that, an improved robustness regarding an ability to correctly classify a seat occupancy can be accomplished even in the presence of a number of n resonances and a number of k electromagnetic (EM) narrowband interferences.

Preferably, the different fundamental frequencies are selected out of a frequency range between 1 MHz and 10 MHz for improved seat occupancy detection and classification ability.

In some embodiments, the signal voltage source is configured to generate the periodic measurement signals of the at least N different fundamental frequencies in a simultaneous manner. In this way, a measurement frequency is virtually unaffected compared to the case of employing a periodic measurement signal of a single fundamental frequency.

If the focus of an application is not on achieving a high measurement frequency of the capacitive seat occupancy detection and classification system, however, the signal voltage source may be configured to sequentially generate the periodic measurement signals of the at least N different fundamental frequencies.

In some embodiments of the capacitive seat occupancy detection and classification system, the majority decision for determining a final seat occupancy class from the seat occupancy classes determined for each one of the complex impedances determined at the at least N different fundamental frequencies can be expressed as $$M > n + \tfrac{1}{2} + p, \text{ with } p < n + \tfrac{1}{2}$$

wherein M is the number of complex impedances for which a specific seat occupancy class has been determined, and p is a natural number including zero.

For p=0, the majority decision is based on a simple majority, as M has to be larger than $$\frac{N}{2} = \frac{1}{2} \cdot (2n+1) = n + \frac{1}{2}.$$

A case of p≠0 can beneficially be selected for achieving a higher level of confidence for determine the final seat occupancy class. For example, in the case of n=4, which results in a number N of different fundamental frequencies equal to 9, p could be chosen to be 0, 1, 2, 3 and 4 (the case of p=0 has been discussed beforehand).

In this way, the majority decision can be based on M having to be equal to or larger than 6 (for p=1), on M having to be equal to or larger than 7 (for p=2), on M having to be equal to or larger than 8 (for p=3), and on M having to be equal to 9 (for p=4). By that, the majority decision for determining the final seat occupancy class can be adjusted to account for criticality of specific seat occupancy classes.

In another aspect of the invention, a vehicle seat is provided. The vehicle seat comprises a seat structure for erecting the vehicle seat on a passenger cabin floor of the vehicle, a seat cushion having at least one seat foam member, and a seat base supported by the seat structure and configured for receiving the seat cushion. The seat base and the seat cushion are provided for supporting a bottom of a seat occupant.

Furthermore, the vehicle seat includes a backrest that is provided for supporting a back of the seat occupant. Then, the vehicle seat comprises an embodiment of the vehicle seat occupant detection and classification system disclosed beforehand, wherein the capacitive sensor is arranged at the seat cushion or at the backrest of the vehicle seat.

By that, a vehicle seat equipped with a robust seat occupant detection and classification system having an improved robustness with regard to an ability to correctly classify a seat occupancy can be provided.

In yet another aspect of the invention, a method of operating the capacitive seat occupancy detection and classification system disclosed herein is provided.

The method includes steps of
providing a periodic electrical measurement signal of a first fundamental frequency out of the at least N different fundamental frequencies to the capacitive sensor, wherein N equals [(2×n)+1], with n being a natural number larger than 1 representing the number of potential resonances or electromagnetic (EM) narrowband interferences,
determining a complex sense current that is being generated in the capacitive sensor in response to the provided periodic electrical measurement signal,
determining, with reference to a complex reference potential, a complex impedance from the determined sense current,
comparing the determined complex impedance to predetermined threshold values,
determining a seat occupancy class for the determined complex impedance,
repeating the preceding steps for the balance of the periodic measurement signals of the at least N different fundamental frequencies, and
determining a final seat occupancy class by conducting a majority decision among the seat occupancy classes determined for each one of the complex impedances determined at the at least N different fundamental frequencies.

BRIEF DESCRIPTION OF THE DRAWINGS

Further details and advantages of the present invention will be apparent from the following detailed description of not limiting embodiments with reference to the attached drawing, wherein.

DESCRIPTION OF THE ILLUSTRATED EMBODIMENTS

Figure 1:
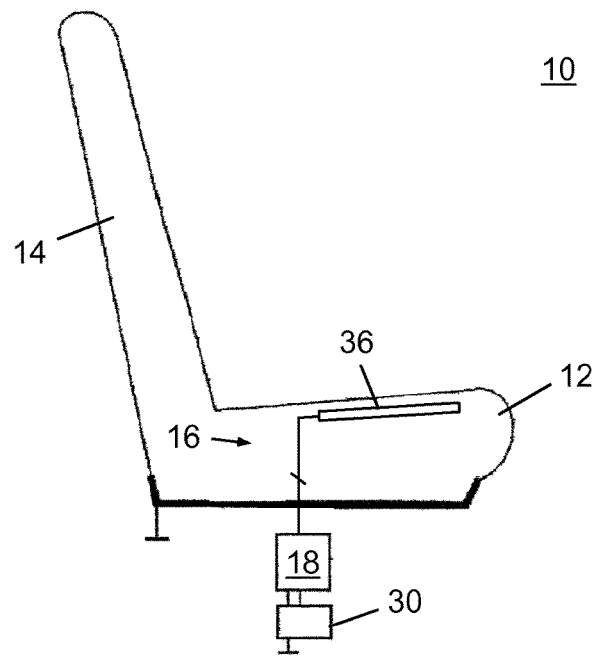
FIG. 1 schematically shows a vehicle seat comprising a capacitive seat occupancy detection and classification system in accordance with an embodiment of the invention.

FIG. 1 schematically shows a vehicle seat 10 comprising a capacitive seat occupancy detection and classification system 16 in accordance with an embodiment of the invention. The vehicle seat 10 is designed as a seat of a passenger car and includes a seat structure (not shown) by which it is erected on a passenger cabin floor of the passenger car, as is well known in the art.

The vehicle seat 10 further includes a seat base supported by the seat structure and configured for receiving a seat cushion 12 for providing comfort to a seat occupant. The seat cushion 12 of the vehicle seat 10 comprises a seat foam member and a fabric cover, which has been omitted in FIG. 1. The seat base and the seat cushion 12 are provided for supporting a bottom of the seat occupant. A backrest 14 of the vehicle seat 10 is provided for supporting a back of the seat occupant.

The vehicle seat occupant detection and classification system 16 includes a capacitive sensor 36, an impedance measurement circuit 18 and a control and evaluation unit 30. The capacitive sensor 36 is located on the A-surface of the seat cushion 12, underneath the fabric cover. The impedance measurement circuit 18 and the control and evaluation unit 30 are installed in the vehicle, remote from the vehicle seat 10.

Figure 2:
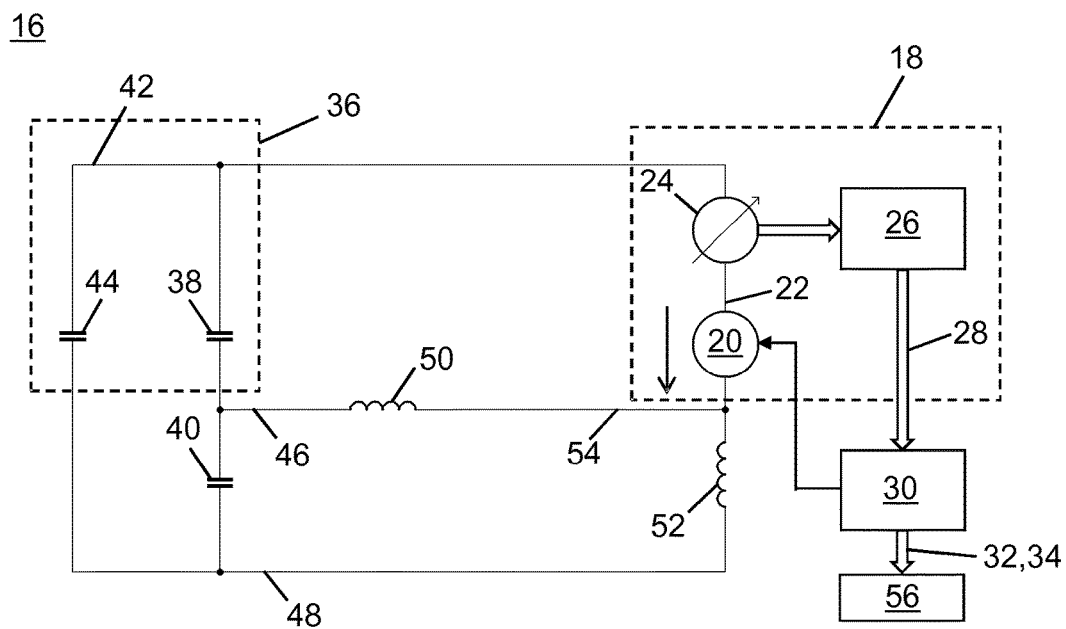
FIG. 2 shows an electric equivalent circuit of a capacitive sensor mounted in a vehicle seat and connected to an impedance measurement circuit of the capacitive seat occupancy detection and classification system pursuant to FIG. 1.

FIG. 2 shows an electric equivalent circuit of the capacitive sensor 36 mounted in the vehicle seat 10 and connected to the impedance measurement circuit 18 of the capacitive seat occupancy detection and classification system 16.

The capacitive sensor 36 has a sense electrode that is terminated by a sense node 42 and a sense-frame impedance 38, which is mainly of capacitive nature, connected between the sense node 42 and a seat frame that forms part of the seat structure and is represented in FIG. 2 by a seat frame node 46. In the shown example, the impedance between frame node 46 and a vehicle chassis node 48, which can in principle be a combination of capacitance, resistance and inductance, is chosen to be a capacitance 40 only. The capacitance is chosen to easily show where the resonance comes from. Further according to FIG. 2 an inductor is shown to describe a wiring inductance 50 between the seat frame and a measurement ground 54. FIG. 2 comprises another inductor to represent a wiring inductance 52 between the vehicle chassis node 48 and the measurement ground 54. It should be noted that each of the impedances between the seat frame and a measurement ground 54 or between the vehicle chassis node 48 and the measurement ground 54 can in principle be a combination of capacitance, resistance and inductance. In the shown example, these impedances are represented as simple inductors for illustration purposes.

The capacitive sensor 36 is electrically connected to the impedance measurement circuit 18. The capacitive sensor 36 is configured for being operated in loading mode. A sense current flowing through the sense node 42 is indicative of a position of an object relative to the capacitive sensor 36. An object approaching the sense electrode is represented in the electric equivalent circuit diagram of FIG. 1 by an unknown impedance 44 (shown as a capacitor) that is connected to a ground potential formed by the vehicle chassis node 48.

The impedance measurement circuit 18 includes a signal voltage source 20, a sense current measurement circuit 24 and a signal processing unit 26. The signal voltage source 20 is configured for providing periodic electrical measurement signals at an output port 22 and at different fundamental frequencies in a frequency range between 1 MHz and 10 MHz. The capacitive sensor 36 is electrically connected via the sense current measurement circuit 24 to the output port 22 for receiving the periodic electrical measurement signals. The sense current measurement circuit 24 is configured to determine complex sense currents that are being generated in the capacitive sensor 36 by the provided periodic measurement signals. The signal processing unit 26 is configured to determine a complex impedance from each of the determined sense currents with reference to a complex reference potential, which is provided by the output port 22 of the signal voltage source 20. The signal processing unit 26 is further configured to provide output signals 28 that are representative of the determined complex impedances.

Due to the additional electric paths shown in FIG. 2 between the seat frame node 46, the vehicle chassis node 48 and the measurement ground 54, resonance oscillations may be created at a frequency that is close to a fundamental frequency of the electrical measurement signal, thereby introducing an intolerably large measurement error.

Figure 4:
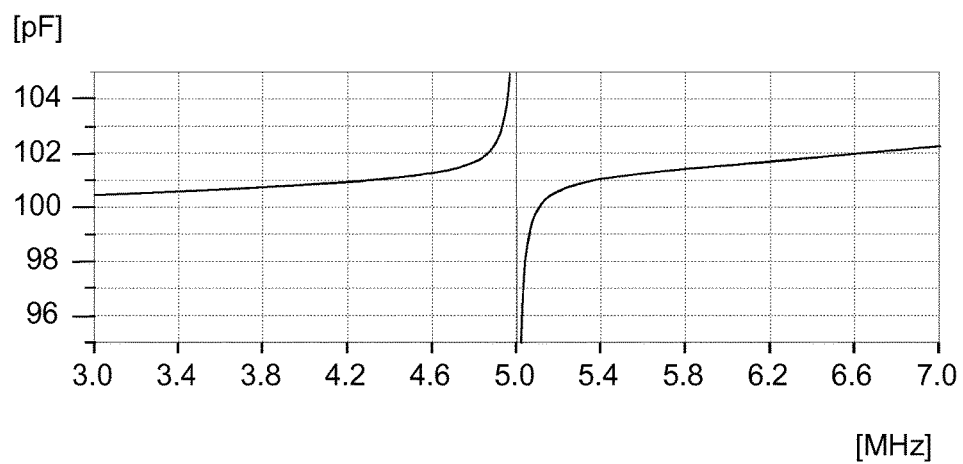
FIG. 4 illustrates a calculated capacitance that can theoretically be measured with the capacitive seat occupancy detection and classification system pursuant to FIG. 1 by employing periodic measurement signals in a frequency range between 2 MHz and 7 MHz and in the presence of a resulting resonance at a frequency of 5 MHz.

A result of an exemplary calculation on the basis of the equivalent circuit of FIG. 2 and the values below is shown in FIG. 4 for employed periodic measurement signals in a frequency range between 2 MHz and 7 MHz:

capacitance representing the unknown impedance 44: 50 pF
capacitance representing the sense-frame impedance 38: 50 pF
capacitance representing the impedance 40 between seat frame and vehicle chassis: 2 nF
wiring inductance 50/resistance representing the impedance between seat frame node 46 and measurement ground 54: 300 nH, 10 mΩ
wiring inductance 52/resistance representing the impedance between vehicle chassis node 48 and measurement ground 54: 200 nH, 10 mΩ

In FIG. 4, the determined complex impedance is illustrates as a calculated capacitance. It is evident from FIG. 4 that an intolerably large measurement will occur if the fundamental frequency of the electrical measurement signal is selected close to 5 MHz.

The capacitive seat occupancy detection and classification system 16 solves this problem by employing periodic measurement signals of N different fundamental frequencies, wherein N is a natural number of at least 3, as will be described later on.

To this end, the signal voltage source 20 is configured to generate periodic measurement signals of N different fundamental frequencies, wherein N is a natural number of at least 3. In this specific embodiment, the signal voltage source 20 is configured to generate the measurement signals of different fundamental frequencies in a sequential manner. The signal processing unit 26 is configured to provide output signals 28 that are representative of the complex impedances determined at the N different fundamental frequencies.

The control and evaluation unit 30 is configured to receive the output signals 28 that are representative of the complex impedances as input signals, and is configured to compare each of the complex impedances determined at the N different fundamental frequencies to two distinct predetermined threshold values.

Based on the result of the comparing, the control and evaluation unit 30 is configured to determine a seat occupancy class for each one of the complex impedances determined at the N different fundamental frequencies. The seat occupant classification includes the seat occupancy classes "empty", "child" and "adult".

The number N may be selected a priori without any knowledge on a number n of resonances or a number k of narrowband EM interferences that exist in the installed state of the capacitive seat occupancy detection and classification system 16 in the frequency range under consideration.

If a priori information on a number n of resonances in the frequency range under consideration may be available for instance from measurement, the number N may be selected according to N=(2×n)+1. In the academic example of FIG. 4, n equals 1, and a number N of 3 would suitably be selected.

A priori information on a number n of resonances and a number k of narrowband EM interferences in the frequency range under consideration may be available for instance from measurement in the installed state of the capacitive seat occupancy detection and classification system 16. EM narrowband interferences may be detected by first performing an interference detection measurement by switching off the signal voltage source 20 and measuring a potentially interfering current with the sense current measurement circuit 24. Those fundamental frequencies for the periodic measurement signals close to which an interfering current has been detected will be left out during a subsequent resonance suppressing measurement and detection. In this case, the number N may be selected according to N=(2×n)+1+k.

In this specific embodiment, no a priori information on resonances or narrowband EM interferences is available. The number N of fundamental frequencies of periodic measurement signals has been selected as 9. The fundamental frequencies are equidistantly spaced in the frequency domain in the frequency range between 1 MHz and 10 MHz.

The control and evaluation unit 30 is further configured to determine a final seat occupancy class derived by a majority decision among the seat occupancy classes determined for each one of the complex impedances determined at one of the 9 different fundamental frequencies, as will be presented in a description of a method of operation hereinafter.

Moreover, the control and evaluation unit 30 is configured to generate an output signal 32 that is indicative of the determined final seat occupancy class. The output signal 32 generated by the control and evaluation unit 30 can be provided to an airbag control unit 56 of the vehicle via a CAN communication link 34 for the purpose of air bag activation control. For instance, if the determined final seat occupancy class is "adult", an airbag of the vehicle seat 10 will be deployed.

Figure 3:
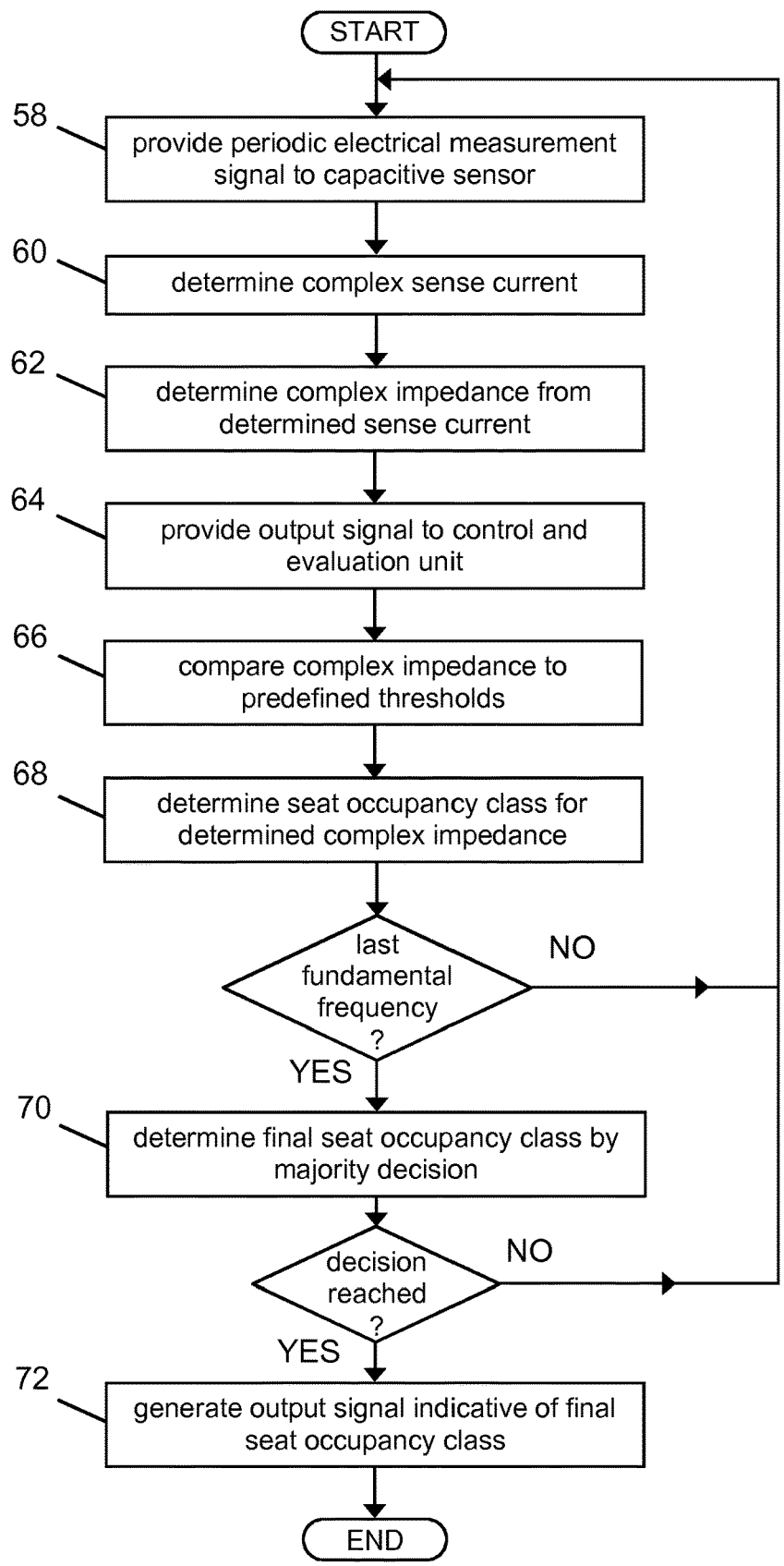
FIG. 3 is a flow chart of a method of operating the capacitive seat occupancy detection and classification system pursuant to FIG. 2.

In the following, an embodiment of a method of operating the capacitive seat occupancy detection and classification system 16 pursuant to FIG. 1 will be described. A flowchart of the method is provided in FIG. 3. In preparation of using the capacitive seat occupancy detection and classification system 16, it shall be understood that all involved units and devices are in an operational state and configured as illustrated in FIGS. 1 and 2.

In a first step 58 of the method, a periodic electrical measurement signal of a first fundamental frequency out of the 9 different fundamental frequencies is provided by the signal voltage source 20 to the capacitive sensor 36.

In a next step 60, a complex sense current that is being generated in the capacitive sensor 36 in response to the provided periodic electrical measurement signal is determined by the sense current measurement circuit 24.

In another step 62, the signal processing unit 26 determines a complex impedance from the determined sense current with reference to the complex reference potential provided by the output port 22 of the signal voltage source 20. In the next step 64, an output signal 28 that is representative of the determined complex impedance is provided to and received by the control and evaluation unit 30.

Then, the control and evaluation unit 30 compares the determined complex impedance to predetermined threshold values residing in a digital data storage unit (not shown) of the control and evaluation unit 30 in another step 66.

Based on the result of the step 66 of comparing, the control and evaluation unit 30 determines a seat occupancy class for the determined complex impedance out of a group of predefined seat occupancy classes in a next step 68.

The preceding steps 58-68 are repeated for the balance of the periodic measurement signals of the 9 different fundamental frequencies.

In the following step 70, a final seat occupancy class is determined by the control and evaluation unit 30 by conducting a majority decision among the seat occupancy classes determined for each one of the complex impedances determined at the 9 different fundamental frequencies.

The majority decision can be expressed as a condition of $M>n+\frac{1}{2}+p$ with $p<n+\frac{1}{2}$, wherein M is the number of complex impedances for which a specific seat occupancy class has been determined by the control and evaluation unit 30, and p is a natural number including zero. In this specific embodiment, n equals 4 and p is selected to be 2. Consequently, the condition for the majority decision means that the same seat occupancy class must have been determined by the control and evaluation unit 30 for (M=) 7 complex impedances determined at the 9 different fundamental frequencies for determining this seat occupancy class as the final seat occupancy class.

Then, in another step 72, the control and evaluation unit 30 generates an output signal 32 that is indicative of the determined final seat occupancy class if the condition for the majority decision was met. The output signal 32 is transferred to the airbag control unit 56 to serve as a basis for a decision to deploy an air bag system to the vehicle seat 10.

While the invention has been illustrated and described in detail in the drawings and foregoing description, such illustration and description are to be considered illustrative or exemplary and not restrictive; the invention is not limited to the disclosed embodiments.

Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

The invention claimed is:

1. A capacitive seat occupancy detection and classification system, including
    an impedance measurement circuit, comprising:
        a signal voltage source that is configured for providing periodic electrical measurement signals at an output port, wherein a capacitive sensor is electrically connectable to the output port for receiving the electrical measurement signals, and wherein the signal voltage source is configured to generate periodic measurement signals of N different fundamental frequencies, wherein N is a natural number of at least 3,
        a sense current measurement circuit that is configured to determine complex sense currents that are being generated in the capacitive sensor by the provided periodic measurement signals of the at least N different fundamental frequencies,
        a signal processing unit that is configured to:
            determine a complex impedance from each of the determined sense currents with reference to a complex reference potential, and to
            provide output signals that are representative of the complex impedances determined at the at least N different fundamental frequencies,
        and
        a control and evaluation unit that is configured to:
            receive the output signals provided by the signal processing unit,
            compare each of the complex impedances determined at the at least N different fundamental frequencies to predetermined threshold values,
            based on the result of the comparing, determine a seat occupancy class for each one of the complex impedances determined at the at least N different fundamental frequencies, and to
            determine a final seat occupancy class derived at least in part by a majority among the seat occupancy classes determined for each one of the complex impedances determined at one of the at least N different fundamental frequencies,
        wherein N equals $[(2\times n)+1]$, with n being a natural number larger than 1 representing the number of potential resonances or electromagnetic (EM) narrowband interferences.

2. The capacitive seat occupancy detection and classification system as claimed in claim 1, wherein the control and evaluation unit is configured to generate an output signal that is indicative of the determined final seat occupancy class.

3. The capacitive seat occupancy detection and classification system as claimed in claim 1, wherein N equals $[(2\times n)+1+k]$, with n being a natural number larger than 1, n representing the number of potential resonances, and k being a number of potential narrowband interferences of the impedance measurement circuit in an installed state.

4. The capacitive seat occupancy detection and classification system as claimed in claim 1, wherein the different fundamental frequencies are selected out of a frequency range between 1 MHz and 10 MHz.

5. The capacitive seat occupancy detection and classification system as claimed in claim 1, wherein the signal voltage source is configured to generate the periodic measurement signals of the at least N different fundamental frequencies in a simultaneous manner.

6. The capacitive seat occupancy detection and classification system as claimed in claim 1, wherein determining the final seat occupancy class from the seat occupancy classes determined for each one of the complex impedances determined at the at least N different fundamental frequencies is determined by a majority decision expressed as $M>n+\frac{1}{2}+p$ with $p<n+\frac{1}{2}$, wherein M is the number of complex impedances for which a specific seat occupancy class has been determined, and p is a natural number including zero.

7. The capacitive seat occupancy detection and classification system as claimed in claim 1, further comprising a capacitive sensor, wherein the capacitive sensor is electrically connected to the output port of the signal voltage source and to the sense current measurement circuit.

8. A vehicle seat, comprising:
    a seat structure for erecting the vehicle seat on a passenger cabin floor of the vehicle, a seat cushion having at least one seat foam member, a seat base supported by the seat structure and configured for receiving the seat cushion, the seat base and the seat cushion being provided for supporting a bottom of a seat occupant, a backrest that is provided for supporting a back of the seat occupant, and a capacitive seat occupant detection and classification system as claimed in claim 7, wherein the capacitive sensor is arranged at the seat cushion or at the backrest.

9. A method of operating the capacitive seat occupancy detection and classification system as claimed in claim 7 in a vehicle seat that includes:

a seat structure for erecting the vehicle seat on a passenger cabin floor of the vehicle, a seat cushion having at least one seat foam member, a seat base supported by the seat structure and configured for receiving the seat cushion, the seat base and the seat cushion being provided for supporting a bottom of a seat occupant, and a backrest that is provided for supporting a back of the seat occupant, wherein the capacitive sensor member is arranged at the seat cushion or at the backrest.

10. A method of operating a capacitive seat occupancy detection and classification system having a capacitive sensor electrically connected to a signal voltage source configured to generate periodic electrical measurement signals, the method including steps of:

providing a periodic electrical measurement signal of a first fundamental frequency out of at least N different fundamental frequencies to the capacitive sensor, wherein N equals [(2×n)+1], with n being a natural number larger than 1 representing the number of potential resonances or electromagnetic (EM) narrowband interferences, determining a complex sense current that is being generated in the capacitive sensor in response to the provided periodic electrical measurement signal, determining, with reference to a complex reference potential, a complex impedance from the determined sense current, comparing the determined complex impedance to predetermined threshold values, determining a seat occupancy class for the determined complex impedance, repeating the preceding steps for each of the periodic measurement signals of the at least N different fundamental frequencies, and determining a final seat occupancy class derived at least in part by a majority among the seat occupancy classes determined for each one of the complex impedances determined at the at least N different fundamental frequencies.

* * * * *